United States Patent [19]

Denda

[11] Patent Number: 4,719,367

[45] Date of Patent: Jan. 12, 1988

[54] SCHMITT TRIGGER CIRCUIT

[75] Inventor: Akira Denda, Tokyo, Japan

[73] Assignee: NEC Corporation, Tokyo, Japan

[21] Appl. No.: 5,989

[22] Filed: Jan. 21, 1987

[30] Foreign Application Priority Data

Jan. 22, 1986 [JP] Japan .................... 61-12377

[51] Int. Cl.$^4$ ............. H03K 3/29; H03K 19/092; H03K 17/60; H03K 5/153
[52] U.S. Cl. .................. 307/290; 307/570; 307/475; 307/443; 307/446
[58] Field of Search ........... 307/290, 570, 255, 246, 307/443, 446, 475, 359

[56] References Cited

U.S. PATENT DOCUMENTS 4,563,594  1/1986  Koyama ........................... 307/443

FOREIGN PATENT DOCUMENTS 0048825  3/1982  Japan ........................... 307/290
0004326  1/1985  Japan ........................... 307/290

*Primary Examiner*—Stanley D. Miller
*Assistant Examiner*—Trong Q. Phan
*Attorney, Agent, or Firm*—Sughrue, Mion, Zinn, Macpeak and Seas

[57] ABSTRACT

For improvement in switching speed, there is provided a Schmit trigger circuit comprising a high-voltage supply line, a low-voltage supply line, a series combination of a bipolar transistor and a resistor provided between the high-voltage supply line and the low-voltage supply line, the bipolar transistor having a base node connected to an input terminal, an intermediate node provided between the bipolar transistor and the resistor, a logic gate having an output node and two input nodes connected to the input terminal and the intermediate node, respectively, and a field effect transistor operative to establish or block a current path between the intermediate node and one of the high-voltage supply line and the low-voltage supply line, the field effect transistor having a gate node connected to the output node of the logic gate.

3 Claims, 6 Drawing Figures

SCHMITT TRIGGER CIRCUIT

FIELD OF THE INVENTION

This invention relates to a Schmitt trigger circuit and, more particularly, to a Bi-MOS implementation of a Schmitt trigger circuit with an improved switching speed.

BACKGROUND OF THE INVENTION

A Schmitt trigger circuit finds a variety of practical application for its hysteresis loop of input-output voltage characteristics. In some applications, the hysteresis range is directly concerned in the circuit behavior, so that it is advantageous to have a construction capable of precisely adjusting the hysteresis range. When a Schmitt trigger circuit is employed in a logic circuit, the Schmitt trigger circuit is expected to operate at a faster switching speed.

It is therefore an important object of the present invention to provide a Schmitt trigger circuit which has a construction capable of precisely adjusting the hysteresis range and performing at an improved switching speed.

SUMMARY OF THE INVENTION

In accordance with one outstanding aspect of the present invention, there is provided a Schmitt trigger circuit comprising (a) a high-voltage supply line, (b) a low-voltage supply line, (c) a series combination of a bipolar transistor and a resistor provided between the high-voltage supply line and the low-voltage supply line, the bipolar transistor having a base node connected to an input terminal, (d) an intermediate node provided between the bipolar transistor and the resistor, (e) a logic gate having an output node and two input nodes connected to the input terminal and the intermediate node, respectively, and (f) a field effect transistor operative to establish or block a current path between the intermediate node and one of the high-voltage supply line and the low-voltage supply line, the field effect transistor having a gate node connected to the output node of the logic gate.

BRIEF DESCRIPTION OF THE DRAWINGS

The problems of the prior-art Schmitt trigger circuits and the features and advantages of a Schmitt trigger circuit according to the present invention will be more clearly understood from the following description taken in conjunction with the accompanying drawings in which.

DESCRIPTION OF THE PRIOR-ART

Figure 1:
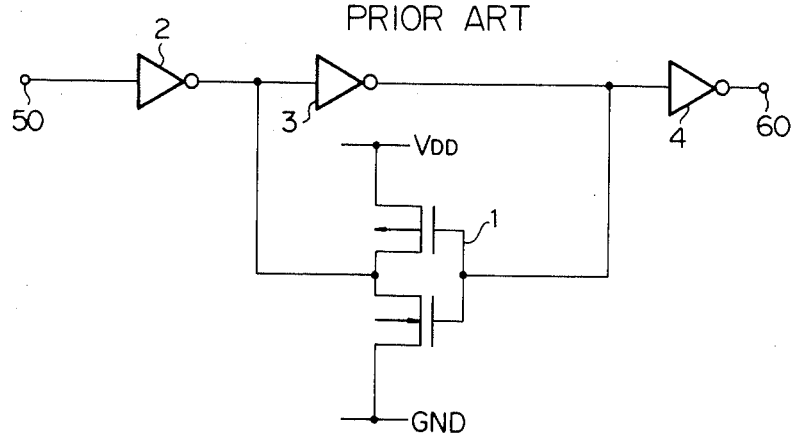
FIG. 1 is a circuit diagram showing the arrangement of a known prior-art Schmitt trigger circuit.

In FIG. 1 of the drawings, there is shown a CMOS implementation of the known Schmitt trigger circuit which comprises CMOS inverter circuits 1, 2, 3 and 4 provided between a certain high-level voltage source VDD and the ground. Each of the CMOS inverter circuits 1, 2, 3 and 4 has a series combination of a p-channel MOS field effect transistor and an n-channel MOS field effect transistor. An example of each inverter circuit is shown in FIG. 1 as the CMOS inverter 1. The CMOS inverter circuits 2, 3 and 4 are connected in series. The output of the CMOS inverter circuit 1 is applied to the input of the CMOS inverter circuit 3 to form a feedback loop which is operative to virtually feed the inverse of the output signal produced by the CMOS inverter 1 to the input node 50. The Schmitt trigger circuit illustrated in FIG. 1 produces a hysteresis loop at the output node 60 thereof, however a drawback has been encountered in the prior-art Schmitt trigger circuit in that the hysteresis range can not be adjusted arbitrarily. This is because the hysteresis range depends on the input and output impedances of the CMOS inverters 1 and 3 which vary in accordance with the manufacturing conditions of the MOS field effect transistors used in the Schmitt trigger circuit.

Figure 2:
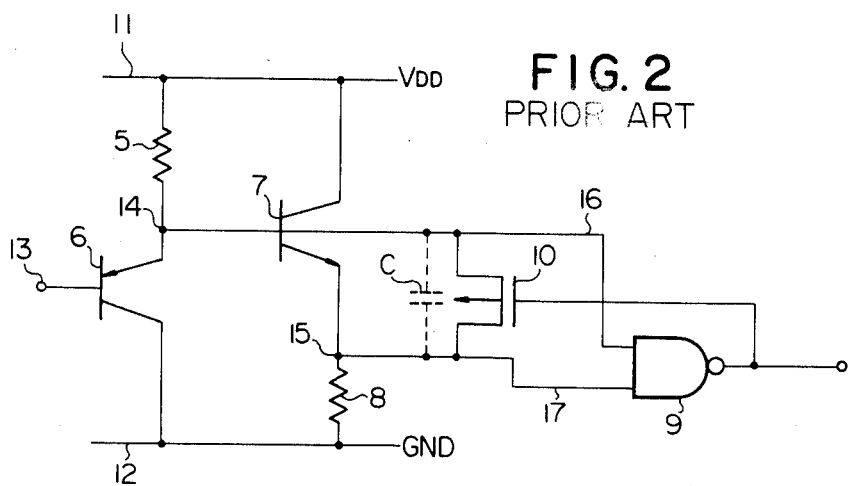
FIG. 2 is a circuit diagram showing the arrangement of a another prior-art Schmitt trigger circuit which has been proposed to eliminate a drawback inherent in the prior-art Schmitt trigger circuit shown in FIG. 1.

In order to eliminate the drawback inherent in the Schmitt trigger circuit of FIG. 1, another circuit arrangement illustrated in FIG. 2 has been proposed. The Schmitt trigger circuit illustrated in FIG. 2 is fabricated on a semiconductor substrate (not shown) and comprises a series combination of a resistor 5 and a p-n-p bipolar transistor 6, a series combination of an n-p-n transistor 7 and a resistor 8, a NAND gate 9 and a p-channel MOS field effect transistor 10.

The series combination of the resistor 5 and the p-n-p bipolar transistor 6 is provided between a high-voltage supply line 11 and a low-voltage supply line 12 and has an input node 13 to which an input signal is applied. The high-voltage line 11 is connected to a source of a certain positive voltage VDD, and the low-voltage line 12 is typically connected to the ground (which is abbreviated by GND in the drawings). The input node 13 supplies the base node of the bipolar transistor 6 with the input signal swinging between the positive voltage VDD and the ground level. When the input signal goes up to the positive voltage VDD, the bipolar transistor 6 produces at the emitter node thereof an output signal capable of going up to a positive voltage level VH1 sufficiently higher than the threshold voltage level VTH of the NAND gate 9.

The series combination of the n-p-n bipolar transistor 7 and the resistor 8 is also provided between the high-voltage supply line 11 and the low-voltage supply line 12, and the emitter node 14 of the p-n-p bipolar transistor 6 is connected to the base node of the n-p-n bipolar transistor 7. The resistance value of the resistor 5 is selected to allow the emitter node of the bipolar transistor 6 to have a voltage level swinging across a certain voltage level at which the base-emitter junction of the n-p-n bipolar transistor 7 is forward-biased, and the n-p-n bipolar transistor 7 produces an output signal at the emitter node 15 thereof which varies in voltage level between the ground level and a positive voltage level sufficiently higher than the threshold voltage level VTH of the NAND gate 9.

The NAND gate 9 has two input nodes connected in parallel to the emitter nodes 14 and 15 through the signal lines 16 and 17, respectively, and produces an output signal swinging between high and low levels to gate the field effect transistor 10. The p-channel MOS transistor 10 is provided between signal lines 16 and 17 for short-circuiting the signal lines 16 and 17 in the presence of the low level output signal of the NAND circuit 9.

The Schmitt trigger circuit thus arranged is operative to produce the output signal with a hysteresis range approximately equal to the base-emitter forward-biased voltage value VF2 of the n-p-n bipolar transistor 7, so that a designer can expect a Schmitt trigger circuit to produce a fixed hysteresis range, free from the variety of the manufacturing conditions.

However, another drawback has been encountered in the proposed Schmitt trigger circuit illustrated in FIG. 2 in that a substantial time delay takes place when the NAND circuit 9 changes its output signal from the high level to the low level in accordance with increasing voltage level at the input node 13. In the presence of the simultaneous high voltage levels on the signal lines 16 and 17, the NAND gate 9 produces the output signal with the low level. When the NAND gate 9 supplies the p-channel MOS transistor 10 with the output signal of the low level, the p-channel MOS transistor 10 tends to turn on for short-circuiting the lines 16 and 17. However, the p-channel MOS transistor 10 has parasitic capacitance C produced along the source/drain junction, and the resistor 5 has a relatively large resistance value R. Then, the signal line 16 needs a certain period of time approximately equal to the time constant CR until reaching the stable condition. This means that the NAND gate 9 also experiences unstable condition, which prevents the Schmitt trigger circuit from operation at a higher switching speed.

DESCRIPTION OF THE PREFERRED EMBODIMENTS

First Embodiment

Figure 3:
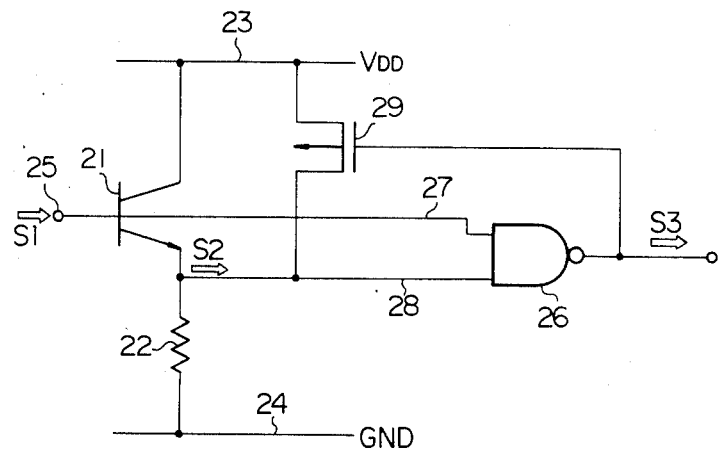
FIG. 3 is a circuit diagram showing the arrangement of a first preferred embodiment according to the present invention.

Referring to FIG. 3 of the drawings, there is shown a circuit arrangement of a Schmitt trigger circuit embodying the present invention. The Schmitt trigger circuit illustrated in FIG. 3 is fabricated on a semiconductor substrate (not shown) and comprises a series combination of an n-p-n bipolar transistor 21 and a resistor 22 which is provided between a high-voltage line 23 and a low-voltage line 24. The high-voltage line 23 is connected to a positive high voltage source VDD, and the low-voltage line 24 is typically connected to the ground. The n-p-n bipolar transistor 21 has a base node connected to an input node 25 where an input signal S1 is applied. The input signal S1 swings its voltage level between the positive voltage level VDD of, for example, 5 volts and the ground level, then the n-p-n bipolar transistor 21 is able to produce at the emitter node thereof an output signal S2 swinging between low voltage level VL approximately equal to the ground level and a sufficiently high voltage level VH.

The Schmitt trigger circuit further comprises a NAND gate 26 which has two input nodes connected in parallel to the base node and the emitter node of the bipolar transistor 21 through signal lines 27 and 28, respectively. The NAND gate 26 has a threshold voltage VTH which is approximately a half of the positive voltage level VDD. Between the high-voltage line 23 and the signal line 28 is provided a p-channel MOS field effect transistor 29 which is gated by the output signal S3 of the NAND gate 26.

Figure 4:
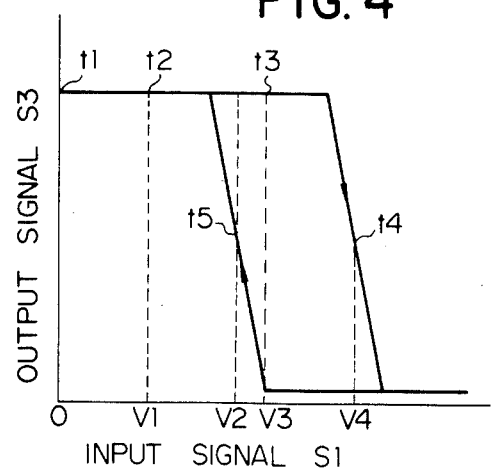
FIG. 4 is a graph which shows a hysteresis loop of the input-output voltage characteristics achieved in the Schmitt trigger circuit illustrated in FIG. 3.

Turning to FIG. 4 of the drawings, description will be made for the circuit behavior of the Schmitt trigger circuit illustrated in FIG. 3. In the presence of the input signal S1 of a low voltage level approximately equal to the ground level, the n-p-n bipolar transistor 21 is turned off with the reverse-biased base-emitter junction. Then the bipolar transistor 21 produces the output signal S2 of the low voltage level VL, and the NAND gate 26 produces the output signal S3 of the high level based on the input signal S1 and the output signal S2 of the bipolar transistor 21 both in the low voltage level (time t1). When the output signal S3 remains in the high voltage level, the p-channel transistor 29 remains in the off state, thereby blocking a current path between the high-voltage line 23 and the signal line 28.

The input signal S1 is increased in voltage level with time and reaches the voltage level V1, then the n-p-n bipolar transistor 21 turns on, but, at this time, the emitter node of the transistor 21 remains in a low voltage level approximately equal to the ground level. The voltage level V1 has a value equal to the sum of the voltage drop produced across the resistor 22 and the base-emitter forward voltage VF of the n-p-n bipolar transistor 21. As described hereinbefore, the NAND gate 26 has the threshold voltage VTH higher than the voltage level V1, so that the NAND gate 26 continues to produce the high level output signal S3 which allows the p-channel MOS transistor 29 to be in the off state (time t2).

When the input signal S1 exceeds the threshold voltage VTH of the NAND gate 26, the n-p-n bipolar transistor 21 produces the output signal S2 with a voltage level VX calculated by $$VX = VTH - VF \qquad \text{Equation 1}$$

The voltage level VX is lower than the threshold voltage VTH of the NAND gate 26, so that the NAND gate 26 is supplied with the sufficient high level signal S1 and the insufficient voltage level signal S2. This results in the output signal S3 of the high level, then the p-channel MOS transistor 29 still remains in the off state (time t3).

However, the input signal exceeds a voltage level V4 which is given by $$V4 = VTH + VF \qquad \text{Equation 2}$$

The n-p-n bipolar transistor 21 produces the output signal approximately equal in voltage level to the threshold voltage VTH. Then, the NAND gate 26 is supplied with the input signal S1 and the output signal S2 both exceeding the threshold voltage VTH and changes the output signal S3 from the high level to the low level (time t4). The output signal S3 of the low level causes the p-channel MOS transistor 29 to turn on, thereby establishing the current path between the high-voltage line 23 and the signal line 28. The current path merely provides a negligible amount of resistance, so that the signal line 28 rapidly goes up to the high voltage level VH or the VDD level which is higher than the voltage level V4. At this time, the signal line 27 remains in a voltage level higher than the threshold voltage VTH of the NAND gate 26. The output signal S3 of the NAND gate 26 rapidly goes down to the low level VL. The operating speed is very high by the condition of the p-channel bipolar transistor 29. This operating speed is not affected from the parasitic capacitance of the p-channel bipolar transistor 29. This results in the NAND gate promptly falls into the stable condition which is conducive to an improved switching speed of the Schmitt trigger circuit.

On the other hand, the input signal S1 is decreased in voltage level with time and reaches a voltage level between the voltage level V4 given by Equation 2 and the voltage level VTH (or V2 ). The NAND gate 26 dose not change the output signal, because the signal line 28 is supplied with the VDD level through the p-channel MOS transistor 29. However, if the input S1 signal goes down to a voltage level lower than the threshold voltage VTH, the NAND gate 26 changes the output signal S3 from the low level to the high level, and according the p-channel MOS transistor 29 turns off for blocking the current path (time t5).

Thus, the Schmitt trigger circuit illustrated in FIG. 3 changes the output signal S3 from the high level to the low level, when the input signal S1 becomes higher than the voltage level V4 and, on the contrary, from the low level to the high level in response to the input signal S1 of the voltage level, when the input signal S1 lowers than the threshold voltage level VTH. The voltage level V4 was given by Equation 2, that is, $$V4 = VTH + VF,$$

so that the Schmitt trigger circuit provides a hysteresis range of VF. The hysteresis range VF is equal to the voltage level across the base-emitter junction where the bipolar transistor 21 is forward-biased. This means that a designer can adjust the hysteresis range arbitrarily.

SECOND EMBODIMENT

Figure 5:
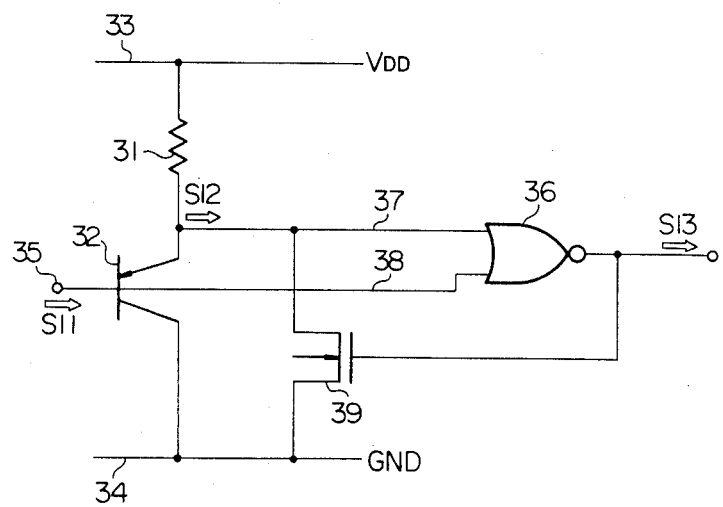
FIG. 5 is a circuit diagram showing the arrangement of a second preferred embodiment according to the present invention.

Referring to FIG. 5 of the drawings, the circuit arrangement of another Schmitt trigger circuit embodying the present invention is shown and comprises a series combination of a resistor 31 and a p-n-p bipolar transistor 32 provided between a high-voltage line 33 and a low-voltage line 34. The high-voltage line 33 is connected to a positive high voltage source VDD of, for example, 5 volts, and the low-voltage line 34 is typically connected to the ground. The p-n-p bipolar transistor 32 has a base node connected to an input node 35 where an input signal S11 is applied. The input signal S11 swings its voltage level between the positive voltage level VDD and the ground level. Further, the resistor 31 has a relatively large resistance value, then the p-n-p bipolar transistor 32 is able to produce at the emitter node thereof an output signal S12 swinging between low voltage level VL slightly higher than the ground level and a sufficiently high voltage level VH approximately equal to the VDD level.

The Schmitt trigger circuit further comprises a NOR gate 36 which has two input nodes connected to the base node and the emitter node of the bipolar transistor 32 through signal lines 37 and 38, respectively. The NOR gate 36 has a threshold voltage VTH which is lower than the aforesaid high voltage level VH but higher than the voltage level V11 at which the p-n-p bipolar transistor 32 changes its operating state. The voltage level V11 has a value lower than that of the positive voltage level VDD by the total value produced by the voltage drop across the resistor 31 and that of the base-emitter forward voltage level VF of the p-n-p bipolar transistor 32. Between the low-voltage line 34 and the signal line 37 is provided an n-channel MOS field effect transistor 39 which is gated by the output signal S13 of the NOR gate 36.

Figure 6:
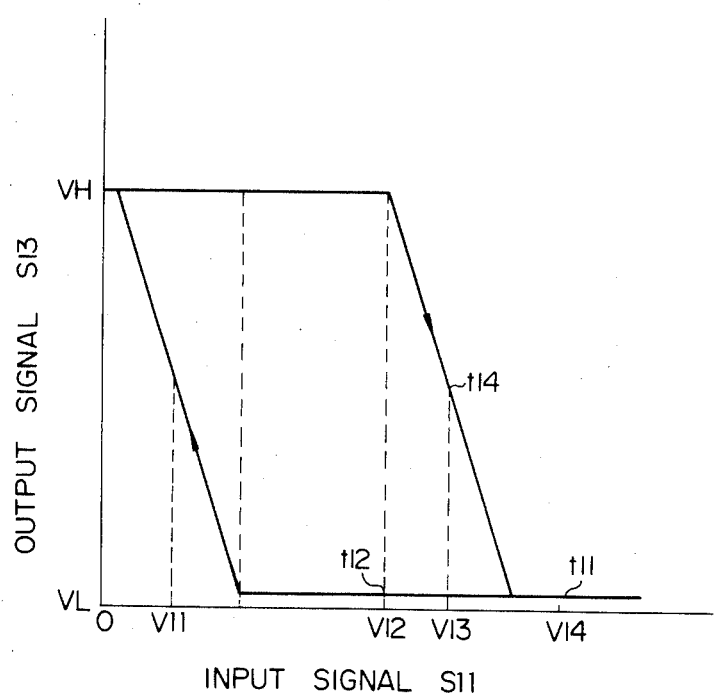
FIG. 6 is a graph which shows a hysteresis loop of the input-output voltage characteristics achieved in the Schmitt trigger circuit illustrated in FIG. 5.

Turning to FIG. 6 of the drawings, there is shown a graph showing a hysteresis loop achieved by the Schmitt trigger circuit illustrated in FIG. 5. In the presence of the input signal S11 of a high voltage level V14 approximately equal to the VDD level, the p-n-p bipolar transistor 32 is turned off with the reverse-biased base-emitter junction. Then, the bipolar transistor 32 produces the output signal S12 of the high voltage level VH, and the NOR gate 36 produces the output signal S13 of the low level based on the input signal S11 and the output signal S12 of the bipolar transistor 32 both exceeding the threshold voltage level VTH. When the output signal S13 remains in the low voltage level, the n-channel MOS transistor 39 remains in the off state, thereby blocking the current path between the low-voltage line 34 and the signal line 37 (time t11).

The input signal S11 is decreased in voltage level with time and has a voltage level V12. The the p-n-p bipolar transistor 32 remains in the off state and produces the output signal S12 having a voltage level higher than the threshold voltage VTH. This results in the output signal S13 of the low level which keeps the n-channel MOS transistor 39 in the off state (time t12).

When the input signal S11 lowers to the voltage level V11 which has the same value as the threshold voltage VTH, the p-n-p bipolar transistor 32 is turned on and produces the output signal S12 of the low voltage level VL. The NOR gate 36 is supplied with the input signal S11 and the output signal S12 both in the low levels, then the NOR gate 36 produces the output signal S13 of the high level VH which causes the n-channel MOS transistor 39 to turn on (time t13). As the n-channel MOS transistor 39 turns on at time t13, a current flows from the signal line 37 to the low-voltage line 34 through the n-channel MOS transistor 39 but is subjected a negligible amount of resistance, so that the signal line 37 rapidly goes down to the ground level which in turn causes the signal line 38 to be decreased in voltage level by the function of the p-n-p bipolar transistor 32. Thus, both of the signal lines 37 and 38 are fixed to the respective low voltage levels as soon as the NOR gate 36 changes the output signal from the low level to the high level even if the n-channel transistor 39 provides a parasitic capacitance produced along the source/drain junctions. This results in the NOR gate 36 promptly falls into the stable condition which is conducive to an improved switching speed of the Schmitt trigger circuit.

On the other hand, the input signal S11 is increased in voltage level with time and reaches the threshold voltage level VTH or the voltage level V11, then the p-n-p bipolar transistor 32 produces the output signal S13 of a voltage level higher than the threshold voltage level VTH by the base-emitter forward-biased voltage value thereof. The NOR gate 36 keeps its output signal S12 at the high level VH. When the input signal S11 reaches the voltage level V13 which is higher than the threshold voltage VTH (or the voltage level V11) by the base-emitter forward voltage VF of the p-n-p bipolar transistor 32. The NOR gate 36 changes its output signal S13 from the high level to the low level (time t14), and accordingly the n-channel MOS transistor 39 turns off for blocking the current path between the signal line 37 and the low voltage line 34. The hysteresis range has a value approximately equal to the difference between the voltage levels V14 and V11, that is the base-emitter forward voltage value of the p-n-p bipolar transistor 32. Thus, a designer also can adjust the hysteresis range arbitrarily.

As will be understood from the foregoing description, the Schmitt trigger circuit according to the present invention is advantageous over the prior-art Schmitt trigger circuits in that the output signal is produced at an improved switching speed and in that the hysteresis range is precisely adjusted to the base-emitter forward-biased voltage value VF of the bipolar transistor incorporated therein.

Although particular embodiments of the present invention have been shown and described, it will be obvious to those in skilled in the art that various modifications may be made without departing from the spirit and scope of the present invention.

What is claimed is:

1. A Schmitt trigger circuit comprising
   (a) a high-voltage supply line,
   (b) a low-voltage supply line,
   (c) a series combination of a bipolar transistor and a resistor provided between said high-voltage supply line and said low-voltage supply line, said bipolar transistor having a base node connected to an input terminal,
   (d) an intermediate node provided between said bipolar transistor and said resistor,
   (e) a logic gate having an output node and two input nodes connected to said input terminal and said intermediate node, respectively, and
   (f) a field effect transistor operative to establish or block a current path between said intermediate node and one of said high-voltage supply line and said low-voltage supply line, said field effect transistor having a gate node connected to the output node of said logic gate.

2. A Schmitt trigger circuit as set forth in claim 1, in which said bipolar transistor is of an n-p-n type and in which said logic gate performs a NAND function, wherein said field effect transistor is of a p-channel type.

3. A Schmitt trigger circuit as set forth in claim 2, in which said bipolar transistor is of a p-n-p type and in which said logic gate performs a NOR function, wherein said field effect transistor is of an n-channel type.

* * * * *